United States Patent
Kronholz et al.

(10) Patent No.: US 8,722,486 B2
(45) Date of Patent: May 13, 2014

(54) ENHANCING DEPOSITION UNIFORMITY OF A CHANNEL SEMICONDUCTOR ALLOY BY FORMING A RECESS PRIOR TO THE WELL IMPLANTATION

(75) Inventors: Stephan Kronholz, Dresden (DE); Maciej Wiatr, Dresden (DE); Roman Boschke, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 547 days.

(21) Appl. No.: 12/908,053

(22) Filed: Oct. 20, 2010

(65) Prior Publication Data
US 2011/0156172 A1 Jun. 30, 2011

(30) Foreign Application Priority Data
Dec. 30, 2009 (DE) .......................... 10 2009 055 394

(51) Int. Cl.
*H01L 21/8238* (2006.01)

(52) U.S. Cl.
USPC ........... 438/217; 438/197; 438/199; 438/289; 257/204; 257/288; 257/402

(58) Field of Classification Search
USPC ........ 257/288, 204, 202, 402; 438/FOR. 187, 438/197, 199, 217, 285, 289
See application file for complete search history.

(56) References Cited

U.S. PATENT DOCUMENTS

| | | | |
|---|---|---|---|
| 2008/0099794 A1* | 5/2008 | Beyer et al. | 257/255 |
| 2008/0135873 A1* | 6/2008 | Fiorenza et al. | 257/190 |
| 2010/0193881 A1 | 8/2010 | Kronholz et al. | 257/402 |

FOREIGN PATENT DOCUMENTS

DE 102009006886 A1 8/2010 .......... H01L 21/8234

OTHER PUBLICATIONS

Translation of Official Communication from German Patent Office for German Patent Application No. 10 2009 055 394.0 dated Mar. 22, 2011.

* cited by examiner

*Primary Examiner* — Thanh Y Tran
(74) *Attorney, Agent, or Firm* — Amerson Law Firm, PLLC

(57) ABSTRACT

When forming sophisticated gate electrode structures requiring a threshold adjusting semiconductor alloy for one type of transistor, a recess is formed in the corresponding active region, thereby providing superior process uniformity during the deposition of the semiconductor material. Moreover, the well dopant species is implanted after the recessing, thereby avoiding undue dopant loss. Due to the recess, any exposed sidewall surface areas of the active region may be avoided during the selective epitaxial growth process, thereby significantly contributing to enhanced threshold stability of the resulting transistor including the high-k metal gate stack.

22 Claims, 6 Drawing Sheets

ENHANCING DEPOSITION UNIFORMITY OF A CHANNEL SEMICONDUCTOR ALLOY BY FORMING A RECESS PRIOR TO THE WELL IMPLANTATION

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface defined by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although, generally, usage of high speed transistor elements having an extremely short channel may be restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, transistor performance may also be increased by providing an appropriate conductive material for the gate electrode to replace the usually used polysilicon material, at least at the interface to the gate insulation layer, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance, even at an increased thickness, compared to a silicon dioxide layer, while additionally maintaining leakage currents at an acceptable level. On the other hand, the metal-containing non-polysilicon material, such as titanium nitride and the like, may be formed so as to directly connect to the high-k dielectric material, thereby substantially avoiding the presence of a depletion zone. As the threshold voltage of the transistors is significantly affected by the work function of the gate electrode material that is positioned near and in contact with the gate dielectric material, an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material in the channel region that forms an interface with the gate dielectric material, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes for adjusting the work function and thus the threshold voltages in a very advanced process stage.

It turns out, however, that the manufacturing sequence of forming the threshold adjusting semiconductor alloy may have a significant influence on threshold variability and other transistor characteristics, as will be described in more detail with reference to FIGS. 1a-1e.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Moreover, an isolation structure 102C is formed in the semiconductor layer 102, thereby laterally delineating active regions 102A, 102B. In this context, an active region is to be understood as a semiconductor material in which an appropriate dopant profile is to be created in order to form PN junctions for one or more transistor elements. In the example shown, the active region 102A corresponds to a P-channel transistor having a corresponding well implantation species, such as an N-type species, incorporated therein, while the active region 102B represents an N-channel transistor and thus includes a P-type well dopant species. Additionally, a mask layer 103 is formed in the active regions 102A, 102B in the form of a silicon dioxide material, which may be grown on the active regions 102A, 102B. Furthermore, an etch mask 104 is provided such that the active region 102B is covered, while the active region 102A, i.e., the mask layer 103 formed thereon, is exposed to an etch ambient 105.

The semiconductor device 100 as illustrated in FIG. 1a may be formed on the basis of the following conventional process strategies. First, the isolation structure 102C is formed on the basis of well-established lithography, etch, deposition, planarization and anneal techniques in which, for instance, a trench is formed in the semiconductor layer 102 on the basis of a lithography process, which is subsequently to be filled with an appropriate insulating material, such as silicon dioxide, silicon nitride and the like. After removing any excess material and planarizing the surface topography, the further processing is typically continued by performing a plurality of implantation sequences using an appropriate masking regime in order to introduce the required dopant species for generating the basic well doping concentration in the active regions 102A, 102B corresponding to the type of transistors to be formed therein and thereabove. After activating the dopant species and re-crystallizing implantation-induced damage, the further processing is continued by forming the mask layer 103 on the basis of an oxidation process, followed by the deposition of a mask material, such as a resist material, that is subsequently patterned into the mask 104 by well-established lithography techniques. Next, the etch process 105 is performed, for instance by using a wet chemical etch recipe based on, for example, hydrofluoric acid (HF), which may remove silicon dioxide material selectively with respect to silicon material. During the etch process 105, therefore, a material loss in the isolation structures 102C may also occur with a more or less pronounced degree, depending on the process parameters of the etch process 105.

FIG. 1b schematically illustrates the semiconductor device 100 after the above-described process sequence and after removal of the etch mask 104 (FIG. 1a). As described before, an increased surface topography may be created during the preceding etch process since, typically, a portion of the sidewalls 102S of the active region 102A may be exposed, depending on the required over-etch time for reliably removing the mask layer 103 (FIG. 1a) from the active region 102A.

FIG. 1c schematically illustrates the semiconductor device when exposed to a further process ambient 106, which may typically be established in a deposition reactor for performing a selective epitaxial growth process. For example, elevated temperatures may be applied and appropriate reactive gas components may be used in order to remove any contaminants and oxide residues from the exposed surface areas of the active region 102A, for instance in the form of a native oxide and the like. Thus, during the process 106, additional material of the isolation structures 102C, as indicated by 102R, may be removed and also the thickness of the mask layer 103 still covering the active region 102B may be reduced. Consequently, the process 106 may further contribute to an increased exposure of the sidewall surface 102S.

FIG. 1d schematically illustrates the semiconductor device 100 during a selective epitaxial growth process 108, in which process parameters are selected in accordance with well-established recipes such that a significant material deposition is restricted to the exposed active region 102A, while a material deposition on dielectric surface areas, such as the isolation structure 102C and the mask layer 103 is strongly suppressed. During the selective epitaxial growth process 108, a silicon/germanium alloy 109 may, therefore, be selectively formed on the active region 102A wherein, due to the exposed sidewall surface areas 102S, a pronounced material deposition may also occur above the isolation structure 102C. Generally, the material composition of the alloy 109, as well as a thickness thereof, have a strong influence on the finally obtained threshold voltage of the P-channel transistor to be formed in and above the active region 102A. For example, in sophisticated applications, a target thickness of the silicon/germanium alloy 109 may be approximately 10 nm, wherein a thickness variation of several percent may result in a significant variability of the finally achieved transistor characteristics. Thus, due to the exposed sidewall surface areas 102S, a different deposition behavior may occur during the process 108 at the periphery of the active region 102A compared to a central region, which may contribute to a significant thickness non-uniformity.

FIG. 1e schematically illustrates the semiconductor device 100 when exposed to an etch ambient 110 in which the mask 103 (FIG. 1d) is removed selectively with respect to the active regions 102A, 102B. For this purpose, hydrofluoric acid may be used or any other appropriate selective etch chemistry so as to not unduly remove material of the active regions 102A, 102B. On the other hand, during the etch process 110, the resulting surface topography may further be increased by additionally removing material of the isolation structures 102C, thereby contributing to a further pronounced topography at a peripheral area 102P around the active region 102A. Additionally, upon removing the mask layer 103, the final difference in the height level between the active region 102A, which comprises the silicon/germanium alloy 109, and the active region 102B may further be increased, which may also result in an increased degree of complexity during the further processing. That is, after the etch process 110, appropriate gate dielectric materials, which typically comprise a high-k dielectric material, are formed on the basis of oxidation in combination with deposition techniques, followed by the deposition of a complex gate electrode stack, which may typically comprise a metal-containing cap layer for the high-k dielectric material and one or more additional materials. Hence, the different height levels may also result in a certain degree of non-uniformity of the resulting gate stack. Consequently, during the complex patterning sequence for forming gate electrode structures in accordance with a desired critical gate length dimension, the difference in the height levels between the active regions 102A and 102B may result in a different gate length. Furthermore, the previously deposited silicon/germanium alloy 109 may have an intrinsic thickness variability due to the material growth at the exposed sidewall surface areas 102S, which may result in a corresponding variation along the transistor width direction, i.e., the direction perpendicular to the drawing plane of FIG. 1e. Due to the strong dependence of the resulting threshold voltage on the material characteristics of the silicon/germanium alloy 109, a pronounced variability of the threshold voltage along the transistor width direction may also be observed, thereby resulting in a high degree of transistor variability and thus in a less reliable and less predictable transistor operation.

In some sophisticated approaches, the threshold variability of the P-channel transistor is reduced by recessing the active region 102A prior to performing the selective epitaxial growth process in order to avoid or at least suppress the growth of the silicon/germanium alloy 109 at the exposed sidewall surfaces 102S. In this manner, more uniform growth conditions may be achieved across the entire surface of the active region 102A, thereby also providing enhanced uniformity of the material composition and layer thickness of the resulting channel alloy 109. Consequently, in a manufacturing stage as shown in FIG. 1b, the active region 102A may be recessed while the active region 102B is covered by the mask 103.

It has been observed, however, that, although a superior uniformity of the resulting threshold voltage is achieved by applying the latter approach compared to former strategy due to the superior uniformity of the silicon/germanium alloy, the latter approach results in a general increase of the threshold voltage of several tens of mV compared to the former approach, which may thus make the concept of recessing the active region less than desirable, unless the change of threshold voltage may be efficiently compensated.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which patterning uniformity of sophisticated high-k metal gate stacks and the threshold variability of transistors including a threshold adjusting semiconductor alloy may be significantly reduced by enhancing surface topography prior to forming the gate stack without unduly contributing to a threshold shift. To this end, at least the active region receiving the threshold adjusting semiconductor alloy may be recessed prior to depositing the semiconductor alloy, wherein at least the recessing may be performed prior to incorporating the well dopant species into the active region. Without intending to restrict the present application to the following explanation, it is assumed that the shift of threshold voltage in conventional approaches using a recessed configuration for growing the channel semiconductor alloy may be caused by the loss of well dopants during the etch process for recessing the active region. Therefore, at least the recessing and, in some illustrative aspects disclosed herein, also the growth of the channel semiconductor alloy may be completed prior to introducing the well dopant species. In this manner, superior uniformity of the resulting threshold voltage may be achieved, without causing undue threshold voltage shift for a given thickness and material composition of the threshold adjusting semiconductor material.

One illustrative method disclosed herein comprises removing material of an active region selectively to an isolation structure so as to form a recess, wherein the isolation structure laterally delineates the active region in a semiconductor layer of a semiconductor device. The method further comprises forming a layer of a semiconductor alloy in the recess and introducing a well dopant species into the active region through the layer of a semiconductor alloy. Additionally, the method comprises forming a gate electrode structure of a transistor on the layer of a semiconductor alloy, wherein the gate electrode structure comprises a high-k dielectric gate insulation layer and a metal-containing gate electrode material formed on the high-k dielectric gate insulation layer.

A further illustrative method disclosed herein comprises forming a recess in an active region of a semiconductor device, wherein the active region is laterally delineated in a semiconductor layer by an isolation structure. The method further comprises forming a threshold adjusting semiconductor material in the recess by performing a selective epitaxial growth process. Moreover, the method comprises introducing a well dopant species into the active region after forming the recess. The method further comprises forming a gate electrode structure of a transistor on the threshold adjusting semiconductor material.

One illustrative semiconductor device disclosed herein comprises an isolation structure formed in a semiconductor layer and an active region of a P-channel transistor formed in the semiconductor layer that is laterally delineated by the isolation structure so as to define a length and a width of the active region. The semiconductor device further comprises a threshold adjusting semiconductor alloy formed on the active region and extending along the width of the active region so as to substantially not overlap with the isolation structure, wherein the threshold adjusting semiconductor alloy comprises a well dopant species. Additionally, the semiconductor device comprises a gate electrode structure formed on the threshold adjusting semiconductor alloy, wherein the gate electrode structure comprises a high-k dielectric material and a metal-containing electrode material that is formed above the high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
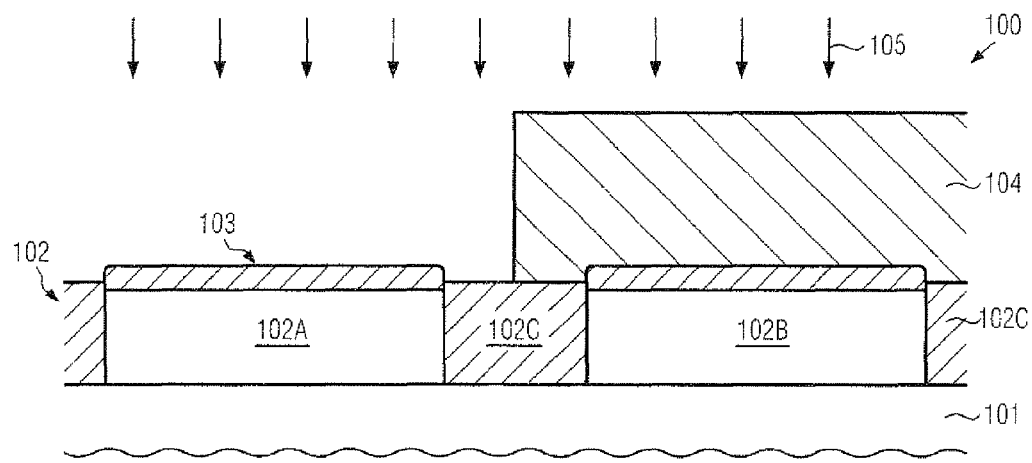
FIGS. 1a-1e schematically illustrate cross-sectional views of a conventional semiconductor device during various manufacturing stages in forming a silicon/germanium alloy selectively on the active region of a P-channel transistor for adjusting the threshold in combination with a sophisticated high-k metal gate material on the basis of conventional process techniques.
Figure 1B:
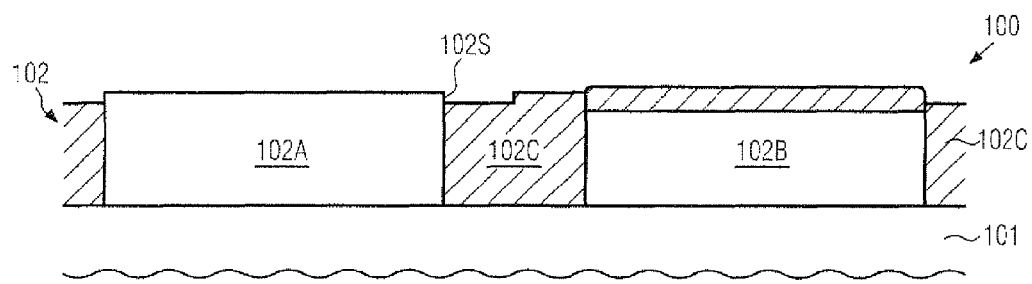
Figure 1C:
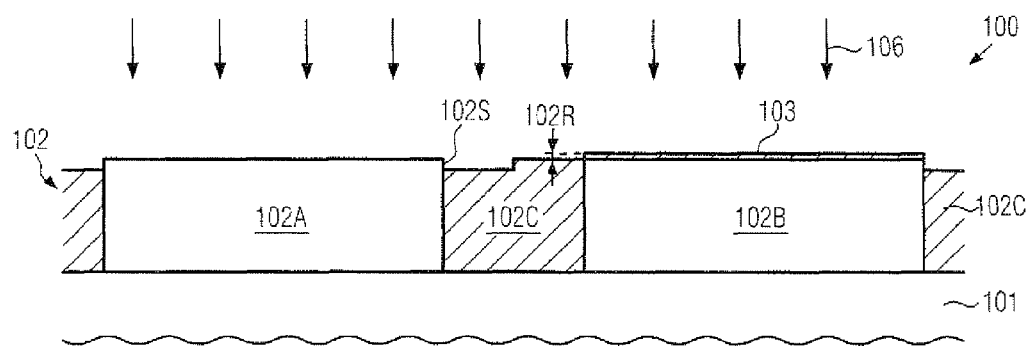
Figure 1D:
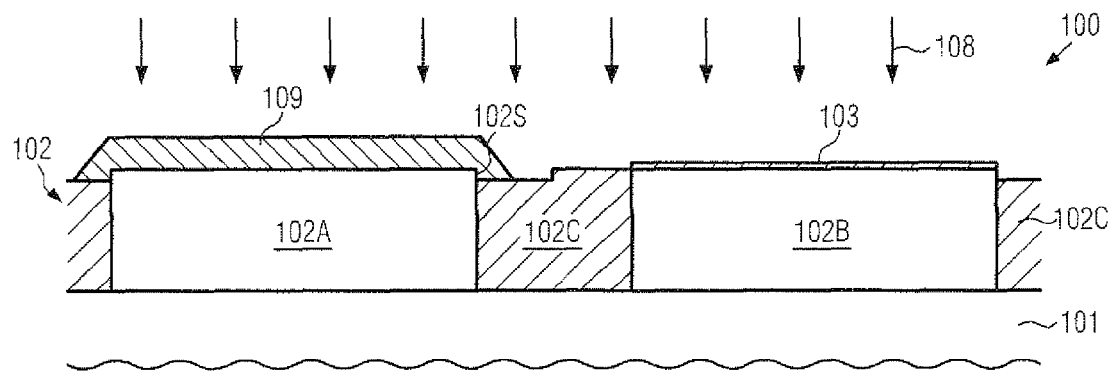
Figure 1E:
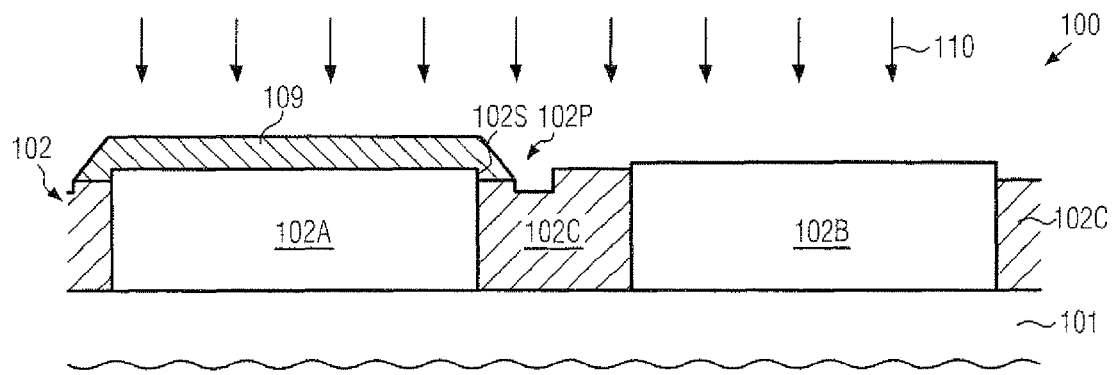

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and techniques in which sophisticated gate electrode structures may be formed in an early manufacturing stage on the basis of a high-k dielectric material and a metal-containing electrode material. In this case, the threshold voltage of one type of transistor may be adjusted, in combination with an appropriate metal species, by providing an appropriate semiconductor material in the channel region in order to obtain the desired band gap offset resulting in the required work function. The threshold adjusting semiconductor alloy, such as a silicon/germanium alloy, may be formed on the basis of superior growth conditions, which in turn may directly translate into reduced thickness non-uniformity of the semiconductor alloy. For this purpose, at least the active region of one type of transistor may be recessed with respect to the isolation structure delineating the active region in order to avoid exposure of sidewall areas of the active region to the selective epitaxial growth ambient, which may conventionally result in a significant variability of material composition and/or thickness of the threshold adjusting semiconductor alloy. The recessing may be performed prior to the incorporation of the well dopant species, thereby avoiding undue dopant loss, which may otherwise result in a shift of the final threshold voltage. In one illustrative embodiment, the recessing and the subsequent selective deposition of the semiconductor alloy may be accomplished in the form of an in situ process, i.e., a process performed in the same process chamber or reactor, thereby contributing to a highly efficient process sequence substantially without affecting overall cycle time compared to conventional strategies. For example, an appropriate etch ambient may be established on the basis of at least a portion of process gas components, which may also be used for establishing the deposition ambient, thereby avoiding the introduction of any additional process resources compared to conventional process recipes. After the growth of the semiconductor alloy, the process sequence for introducing the well dopants may be performed, wherein the additional channel semiconductor alloy may be readily taken into consideration by adapting the implantation parameters, such as the implantation energy, so as to efficiently implant the well dopants and any other dopant species required in this manufacturing stage through the semiconductor alloy.

In some illustrative embodiments, the active region of a transistor that may not require the semiconductor alloy may be covered on the basis of a hard mask, which may be removed without a significant material consumption of the isolation structures, thereby also contributing to a superior surface topography for the deposition of the sophisticated gate stack and the patterning thereof. Furthermore, by forming the corresponding hard mask by deposition, a similar height level for the active regions after the deposition of the threshold adjusting semiconductor alloy may be accomplished, which may result in superior lithography conditions for adjusting similar critical gate length dimensions of gate electrodes of different transistor types.

In still other illustrative embodiments, the masking of active regions that do not require the channel semiconductor material may be achieved by an oxidation process, wherein a difference in oxidation rate may be established upon incorporating the well dopant species into these active regions prior to performing the oxidation process. In this manner, an oxide mask of increased thickness may be formed in these active regions compared to the active region in which the well dopant species is not yet incorporated. As a consequence, the oxide mask material may be removed from the active region requiring the channel semiconductor material without applying a lithography process, since the increased thickness of the oxide mask material formed on the other active regions may ensure that a portion still covers these active regions. Thus, the preserved portion of the oxide mask material may be used as an etch mask and a growth mask during the further processing for forming the recess and growing the channel semiconductor material. Thereafter, the well dopant species may be incorporated through the channel semiconductor material, as described before.

Thus, since the selective modification of the oxidation rate may be accomplished by using the masking and implantation regime that is required for one type of transistor, any additional lithography processes may be avoided.

With reference to FIGS. 2a-2l, further illustrative embodiments will now be described in more detail, wherein reference may also be made to FIGS. 1a-1e, if required.

Figure 2A:
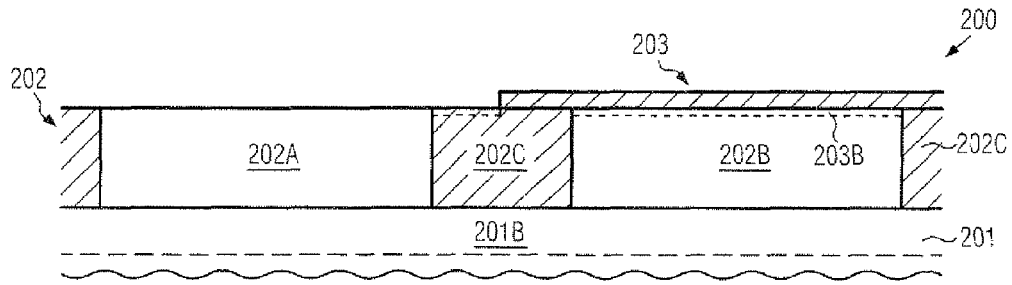
FIGS. 2a-2e schematically illustrate cross-sectional views of a semiconductor device during various manufacturing stages in forming a threshold adjusting semiconductor alloy on a recessed active region prior to incorporating the well dopant species, according to illustrative embodiments.

FIG. 2a schematically illustrates a semiconductor device 200 comprising a substrate 201 above which may be formed a semiconductor layer 202 which may represent any appropriate semiconductor material, such as a silicon material and the like. Furthermore, in some illustrative embodiments, at least in some device areas of the semiconductor device 200, a buried insulating layer 201B may be formed between the substrate 201 and the semiconductor layer 202, thereby providing an SOI configuration, while, in other cases, the buried insulating layer 201B may not be present, as is, for instance, described with reference to the device 100 when referring to FIGS. 1a-1e. The semiconductor layer 202 may comprise an isolation structure 202C, such as a shallow trench isolation, which may laterally delineate or enclose active regions 202A, 202B, wherein at least the active region 202A, representing an active region that requires an adaptation of the band gap offset on the basis of a channel semiconductor alloy, may not have formed therein a well dopant species. The active region 202B may also lack the well dopant species, while, in other embodiments, the well dopant species may be formed therein so as to modify an oxidation behavior, as will be described later on in more detail. Furthermore, in the manufacturing stage shown, a mask layer 203 may be formed such that the active region 202B, possibly in combination with a part of the isolation structure 202C, may be covered, while the active region 202A is exposed, except for any contaminants or minute material residues, such as a native oxide and the like. In some illustrative embodiments, the mask layer 203 may be comprised of an oxide material, as is, for instance, described with reference to FIG. 1a, while, in other cases, the mask layer 203 may be comprised of any appropriate dielectric material, such as silicon dioxide as a deposited material, silicon nitride and the like. For example, using silicon nitride as the mask material may enable the patterning of the layer 203 and the removal thereof in a later manufacturing stage with a significantly reduced degree of material loss of the isolation structures 202C.

The semiconductor device 200 as illustrated in FIG. 2a may be formed on the basis of well-established process techniques for forming the isolation structure 202C and thus laterally delineating the active regions 202A, 202B, thereby defining a length, i.e., in FIG. 2a, the horizontal extension of the active regions 202A, 202B, and a width, i.e., the dimension in a direction that is oriented perpendicular to the drawing plane of FIG. 2a. Without incorporating a well dopant species at least for the active region 202A, the mask 203 may be formed, for instance, by oxidation as is described above with reference to the semiconductor device 100. In this strategy, the mask may grow in and on the active regions 202A, 202B and be subsequently selectively removed from the active region 202A, as indicated by 203B. In this case, a similar material loss in the isolation structures 202C and the active region 202A may occur, as previously described. In other cases, the mask layer 203 may be formed by deposition, thereby reducing the amount of material loss in the isolation structures 202C and the active region 202A, even when comprised of a similar material as the isolation structures 202C. In some illustrative embodiments, the mask layer 203 may be deposited in the form of a dielectric material, such as silicon nitride, which may have a different etch behavior compared to the isolation structure 202C. In this case, the mask layer 203 may be patterned on the basis of, for instance, a resist mask using selective plasma assisted or wet chemical etch recipes, such as hot phosphoric acid and the like. In this case, a superior surface topography, i.e., a less pronounced material loss, may be accomplished and may further enhance the further processing of the device 200.

Figure 2B:
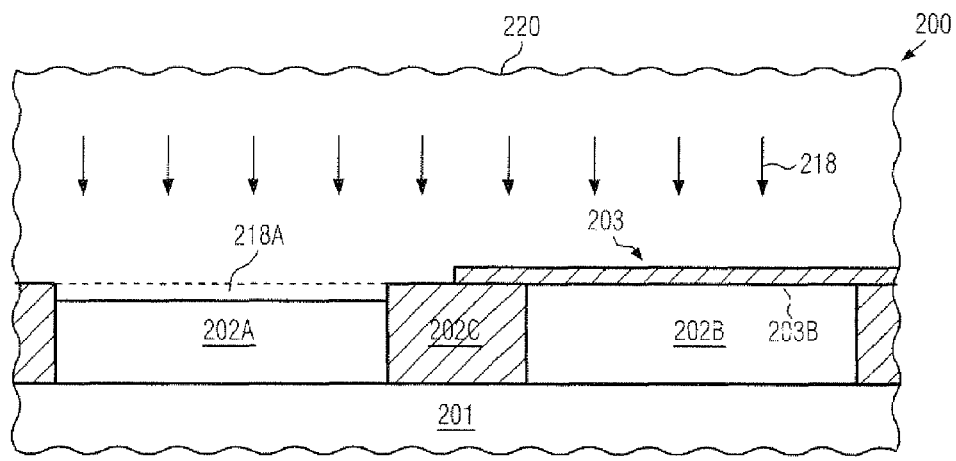

FIG. 2b schematically illustrates the semiconductor device 200 in a further advanced manufacturing stage. As illustrated, the semiconductor device 200 may be positioned in an appropriate manufacturing environment, such as a process chamber or reactor, in which an appropriate temperature, pressure, gas components and the like may be applied or introduced in order to establish an etch ambient 218. For example, the process chamber or reactor 220 may be provided in the form of any well-established deposition tool, which may typically be used for performing selective epitaxial deposition processes. Prior to establishing the etch ambient 218, any appropriate reactive ambient may be established so as to remove additional surface contaminants, such as oxide residues and the like, as is also previously explained with reference to the semiconductor device 100. It should be appreciated that, in this case, a certain degree of material loss of the isolation structures 202C may occur, and also the mask layer 203 may be reduced in thickness, depending on the material composition thereof. In other cases, the mask layer 203 may be provided in the form of, for instance, a silicon nitride material, which may exhibit increased etch resistivity with respect to the corresponding surface cleaning process. Thereafter, the etch ambient 218 may be established which, in one illustrative embodiment, may be accomplished on the basis of process gas components which may also be used in the subsequent selective deposition of a threshold adjusting semiconductor alloy. It is well known that semiconductor materials such as silicon/germanium, silicon/carbon and the like may be deposited on the basis of appropriate precursor gases, which may represent reducible gas components which, in combination with a reducing agent such as hydrogen and the like, may result in a release of the semiconductor species that may deposit on exposed surface areas, wherein additionally other process parameters, such as temperature, pressure and the like, may be adjusted such that the deposition may occur substantially on exposed semiconductor surface areas only. Thus, the etch ambient 218 may be established on the basis of similar process gas components, for instance by omitting the reducing gas component, which may result in a highly selective etch process for removing material of the exposed active region 202A. Thus, a recess 218A may be formed during the etch process 218. Appropriate process parameters, such as etch time and the like, may be readily determined on the basis of experiments and the like. It should be appreciated that, in other embodiments, any appropriate process tool may be used for forming the recess 218A by using a selective etch chemistry, for instance in the form of HCl and the like. Since in this manufacturing stage the well dopants are not yet incorporated at least in the active region 202A, undue dopant loss may be avoided, thereby also substantially avoiding a shift of the threshold voltage of a transistor to be formed in and above the active region 202A.

Figure 2C:
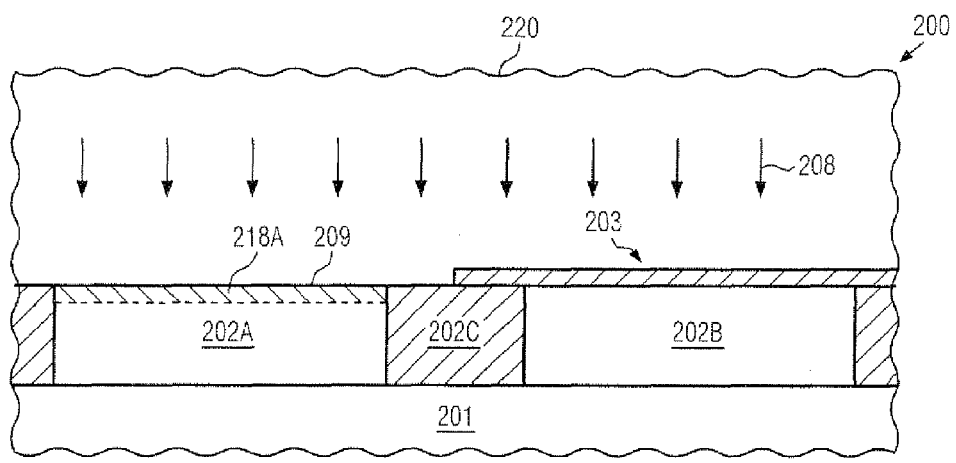

FIG. 2c schematically illustrates the semiconductor device 200 in a further advanced manufacturing stage in which a deposition ambient 208 may be established, which, in one embodiment, may be accomplished within the process environment 220, i.e., in the process chamber or reactor also used for forming the recess 218A. Thus, in this case, the processes 218 and 208 may be considered as an in situ process since the substrate 201 may remain in the same process chamber without requiring any transport activities or exposure to the ambient atmosphere when establishing the deposition ambient 208 after the etch process 218 (FIG. 2b). As explained above, the deposition ambient 208 may be established on the basis of any appropriate selective epitaxial growth recipe, wherein similar process gas components may be used as may have been applied during the preceding process for providing the recess 218A, as explained above. Consequently, during the deposition process 208, a semiconductor alloy 209 may be selectively formed in the recess 218A, wherein enhanced uniformity of the deposition rate may be achieved across the entire active region 202A since any exposed sidewall surface area may not be present, as is the case in the conventional strategy. Consequently, the semiconductor alloy 209, such as a silicon/germanium alloy, may be provided with superior thickness uniformity, while the uniformity with respect to material composition may also be enhanced. For example, the material 209 may be provided with a thickness of approximately 10 nm and less with a variability of approximately 5 percent or significantly less. Furthermore, the material 209 may be provided in the form of a silicon/germanium alloy having a germanium concentration of approximately 25 atomic percent germanium or less. Moreover, due to the recess 218A, the material 209 may be substantially confined by the isolation structure 202C and thus a corresponding overlap of the material 209 with the isolation structure 202C may be avoided.

Figure 2D:
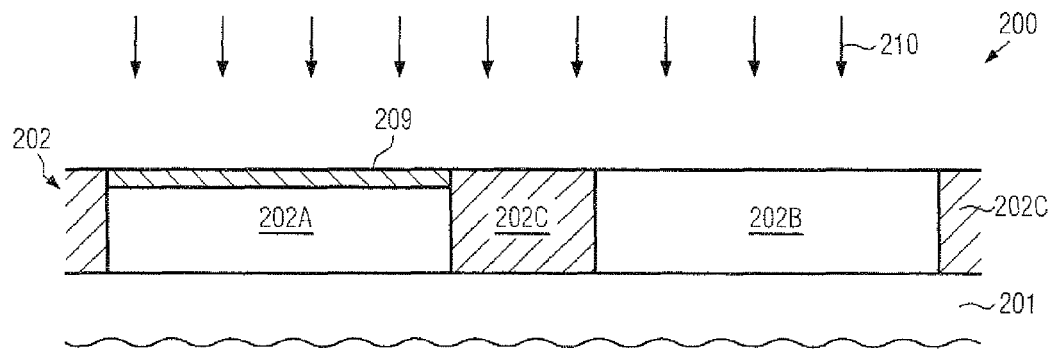

FIG. 2d schematically illustrates the semiconductor device 200 when exposed to a further etch ambient 210, such as a wet chemical etch recipe for removing the mask layer 203 (FIG. 2c) selectively to the semiconductor alloy 209 and the active region 202B. For instance, hydrofluoric acid may be used if the mask layer 203 may be comprised of silicon dioxide, while other chemistries may be applied, such as hot phosphoric acid, when a silicon nitride material is to be removed selectively with respect to the other components. In this case, the material loss of the isolation structures 202C may be maintained at a low level. Hence, a superior overall surface topography may be accomplished since, in total, the material loss of the isolation structures 202C may be reduced, compared to conventional strategies, while a difference in height level of the active region 202A, comprising the alloy 209, and the active region 202B may also be reduced compared to the conventional approaches. Consequently, during the subsequent manufacturing process, for instance for forming sophisticated gate electrode structures, enhanced uniformity of the process results may be accomplished.

Figure 2E:
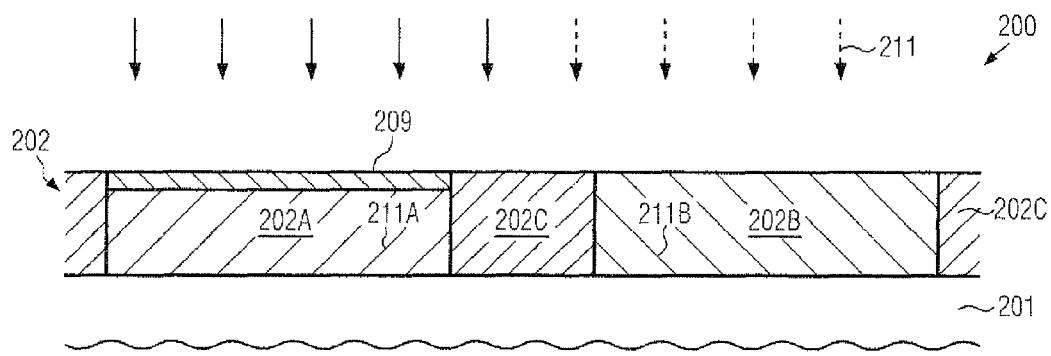

FIG. 2e schematically illustrates the device 200 during a process sequence 211, in which a well dopant species 211A may be introduced at least into the active region 202A. For this purpose, well-established implantation masks may be provided, for instance for masking the active region 202B, when introducing the dopant species 211A into the active region 202A. To this end, the implantation parameters, such as implantation energy, may be adapted to obtain the desired dopant concentration and distribution of the well dopant species 211A and any other implantation species that may have to be incorporated prior to forming a gate electrode structure on the active regions 202A, 202B. That is, the presence of the semiconductor alloy 209 may require an increased implantation energy compared to conventional strategies in which the well implantation is performed prior to forming the semiconductor alloy that may have a higher ion stopping power compared to the initial material of the semiconductor layer 202.

Moreover, as indicated by the dashed arrows, a well dopant species and any other additional implant species 211B may be incorporated into the active region 202B on the basis of an appropriate masking regime.

Figure 2F:
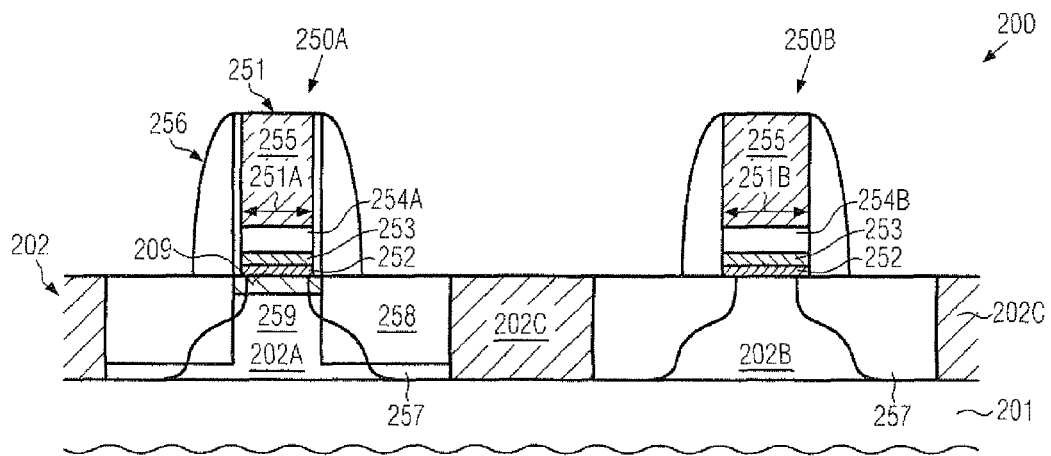
FIG. 2f schematically illustrates a cross-sectional view of the semiconductor device illustrating field effect transistors comprising sophisticated high-k metal gate electrodes in a section along the transistor length direction.

FIG. 2f schematically illustrates the semiconductor device 200 in a further advanced manufacturing stage. As illustrated, a transistor 250A may be formed in and above the active region 202A, which may comprise at least partially the semiconductor alloy 209, while a transistor 250B may be formed in and above the active region 202B. The transistors 250A, 250B may represent a P-channel transistor and an N-channel transistor, respectively, each having a sophisticated gate electrode structure 251 based on a high-k dielectric material 253 and a metal-containing electrode material 254A, 254B, respectively. Furthermore, an additional metal or other electrode material 255 may be provided. For example, the high-k dielectric material 253 may be comprised of any of the above-indicated materials, possibly in combination with a "conventional" dielectric material 252, for instance in the form of silicon dioxide, silicon nitride and the like. Furthermore, the metal-containing electrode material 254A, which may be formed directly on the high-k dielectric material 253 may result, in combination with the threshold adjusting material 209, in an appropriate work function so as to obtain the desired threshold voltage of the transistor 250A, which may exhibit a significantly reduced variability along the transistor width direction, i.e., the direction perpendicular to the drawing plane of FIG. 2e. On the other hand, the transistor 250B may comprise the electrode material 254B which may result in a desired work function of the transistor 250B. It should be appreciated that, typically, the layers 254A, 254B may be comprised of specific metal species, or corresponding metal species may be diffused into the high-k dielectric material 253 in order to provide the required transistor threshold voltages.

Moreover, a spacer structure 256 may be formed on sidewalls of the gate electrode structures 251 in order to act as an implantation mask for forming drain and source regions 257 having a desired lateral and vertical dopant profile. Furthermore, one or both of the transistors 250A, 250B may comprise additional performance enhancing mechanisms, such as a strain-inducing semiconductor alloy 258 formed in the active region, such as the active region 202A, for instance in the form of a silicon/germanium alloy and the like. In this case, the material 258 may induce a desired type of strain in a channel region 259, thereby increasing charge carrier mobility, as explained above.

The semiconductor device 200 as illustrated in FIG. 2f may be formed on the basis of any appropriate manufacturing technique, such as the formation of a material stack for the gate electrode structure 251, which may then be patterned on the basis of sophisticated patterning techniques. Due to the superior uniformity of the material 209 and due to the reduced difference in height levels between the active regions 202A, 202B, superior patterning uniformity may be accomplished, thereby resulting in a gate length 251A, 251B which may exhibit less variability with respect to a desired target value. It should be appreciated that, if required, the material 258 may be formed after the patterning of the gate electrode structure, for instance by forming appropriate cavities in the active region 202A and filling the same with the desired semiconductor alloy. Thereafter, the drain and source regions 257 may be formed in combination with the spacer structure 256, followed by any anneal processes for activating the dopant species and re-crystallizing implantation-induced damage. The further processing may then be continued by forming metal silicide regions, if required, in the drain and source regions 257 and possibly in the material 255 when comprising a significant amount of silicon material. Thereafter, a dielectric material may be deposited, for instance in a stressed state if desired, and contact elements may be formed therein so as to connect to the transistors 250A, 250B.

Figure 2G:
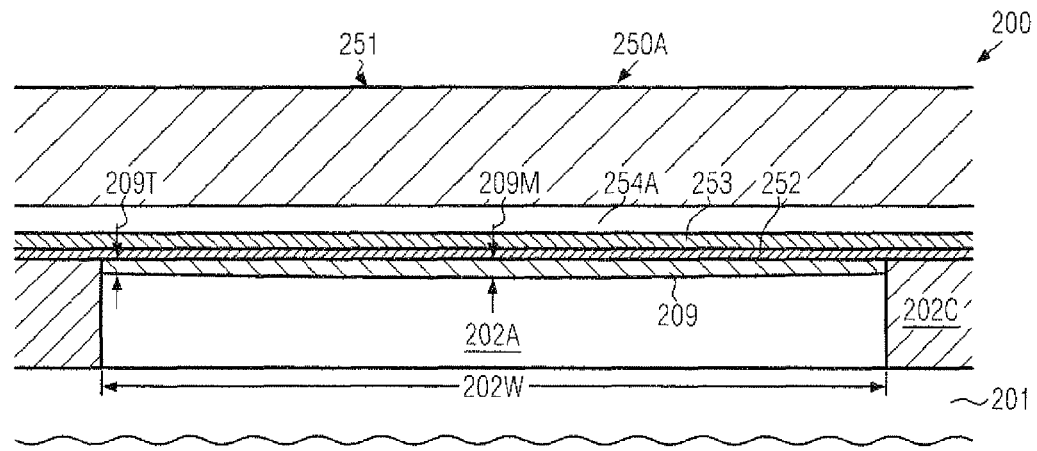
FIG. 2g schematically illustrates a section along the transistor width direction with a gate electrode structure formed on a threshold adjusting semiconductor alloy having a superior uniformity, according to illustrative embodiments.

FIG. 2g schematically illustrates a cross-sectional view of the transistor 250A along the transistor width direction. As illustrated, the threshold adjusting semiconductor material 209 may extend along the entire width 202W of the active region 202A. Thus, the material 209 may substantially not overlap with the isolation structure 202C, even if a certain degree of material loss occurs in these isolation structures during the patterning of the transistor 250A. Moreover, as illustrated, the gate electrode structure 251 may extend above the isolation structure 202C, depending on overall circuit layout of the device 200. Furthermore, a thickness 209T may exhibit a significantly reduced variability along the width 202W and may be less than approximately 5 percent with respect to a maximum width 202M, while, in some illustrative embodiments, even a thickness variation of less than approximately 2 percent or even less may be achieved. Consequently, a corresponding threshold variability along the width 202W may also be reduced compared to conventional semiconductor devices.

Figure 2H:
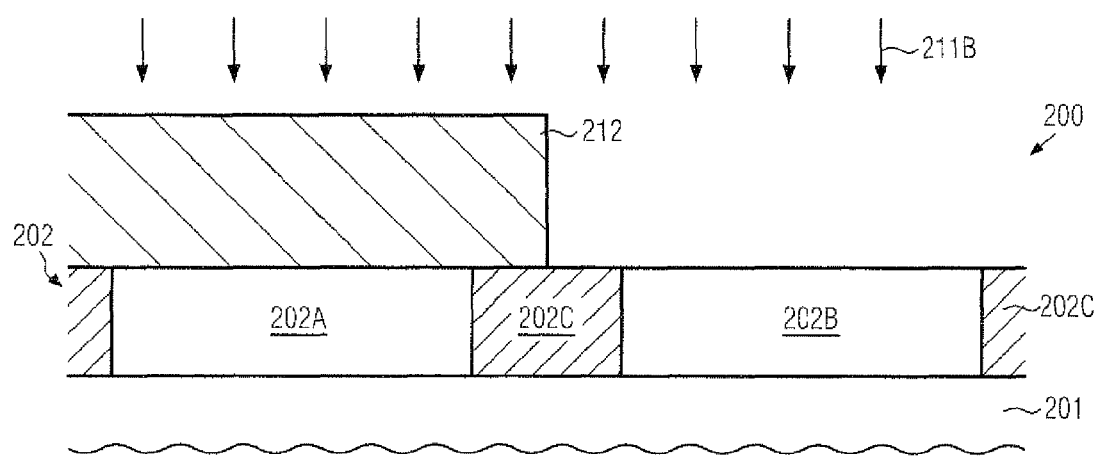
FIGS. 2h-2l schematically illustrate cross-sectional views of the semiconductor device according to further illustrative embodiments in which the recess may be formed without requiring additional lithography processes.

FIG. 2h schematically illustrates a cross-sectional view in the transistor length direction of the semiconductor device 200 in an early manufacturing stage in which an implantation mask 212, such as a resist mask, may be formed such that the active region 202A is masked and the active region 202B is exposed to an implantation sequence 211B for incorporating a well dopant species into the active region 202B. The implantation mask 212 may be formed according to any well-established lithography strategies. The implantation sequence 211B may result in a desired dopant concentration in the active region 202B, while also a certain degree of lattice damage may occur. On the other hand, the active region 202A may remain in a substantially crystalline state, since the well implantation for this region may be performed in a later manufacturing stage. Consequently, after finishing the implantation sequence 211B, the semiconductor materials in the active regions 202A, 202B may have a different behavior in an oxidation process and may thus exhibit different oxidation rates for a given parameter setting of an oxidation process. For example, the presence of the dopant species and the lattice damage may result in an increased oxidation rate for the active region 202B due to the superior oxygen diffusion. It should be appreciated that a corresponding difference in oxidation behavior may be efficiently determined by performing experiments.

Figure 2I:
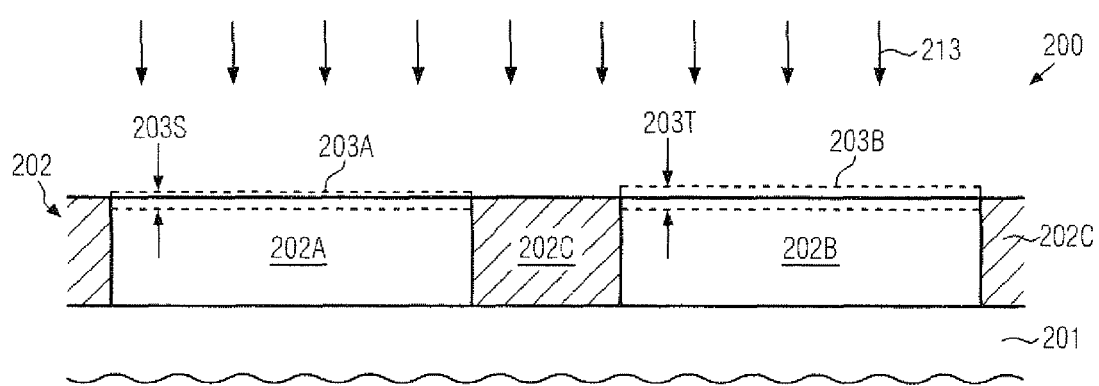

FIG. 2i schematically illustrates the device 200 in a further advanced manufacturing stage after removal of the implantation mask 212 (FIG. 2h). In this stage, the device 200 may be exposed to an oxidizing process 213 in order to form a mask material in and on the active regions 202A, 202B. As discussed above, the different oxidation behavior may result in a mask material 203A formed in and on the active region 202A and having a thickness 203S that is less than a thickness 203T of a mask material 203B formed in and on the active region 202B. For example, the difference in thickness may be approximately 15-20% or more. The oxidation process 213 may be performed such that the excess thickness of the mask material 203B, i.e., the difference of the thickness 203S and 203T, is sufficient so as to provide the required masking effect during the further processing.

Figure 2J:
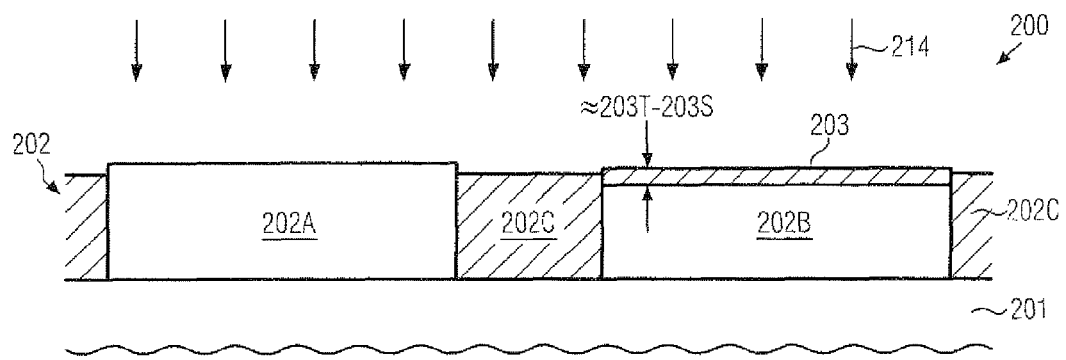

FIG. 2j schematically shows the device 200 when exposed to a reactive process 214 that is configured to remove material of the mask materials 203A, 203B (FIG. 2i). For example, well-controllable wet chemical etch recipes, for instance based on HF, may be applied. In other cases, selective plasma assisted etch processes may be applied. Thus, the active region 202A may be exposed, while a portion of the previously formed mask material 203B (FIG. 2i) may be preserved, as indicated as mask material 203, due to the difference in thickness 203S and 203T. It should be appreciated that material of the isolation structure 202C may also be consumed, wherein, however, in total, a less pronounced surface topography may be created, since the material removal may occur more uniformly with respect to the active regions 202A and 202B and the adjacent isolation regions.

Figure 2K:
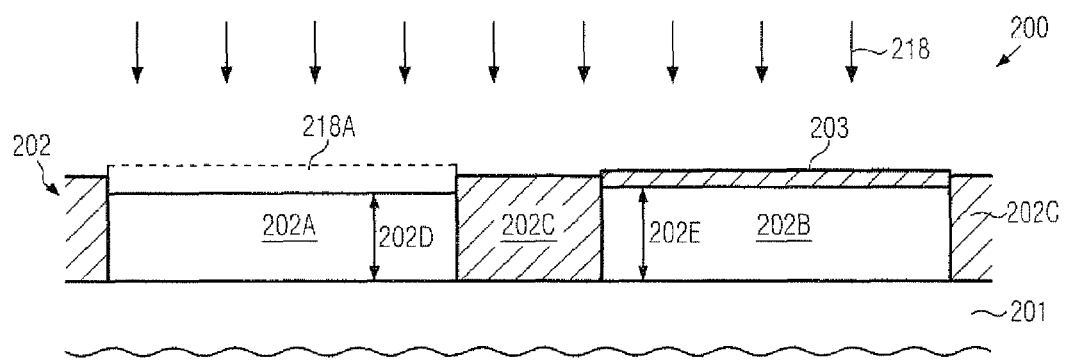

FIG. 2k schematically illustrates the device 200 during the etch process 218 in order to form the recess 218A in the active region 202A, wherein the mask material 203 may act as an etch mask. The etch process 218 may represent any appropriate etch process, for instance performed on the basis of wet chemical etch recipes or highly selective plasma assisted etch processes. In other cases, an etch strategy may be applied as previously explained with reference to FIG. 2b. Thus, compared to strategies explained above, in which the mask 203 of FIG. 2a may be provided on the basis of an oxidation process, a less pronounced difference in height levels 202D, 202E of the recessed active region 202A and the region 202B comprising the oxidized mask 203 may be created, since the height level 202D is substantially defined by the thickness 203S of the mask material 203A of FIG. 2i and the desired depth of the recess 218A, while the height level of the active region 202B is substantially defined by the thickness 203T of FIG. 2i, which may, however, result in a reduced height level compared to a strategy in which both mask materials are formed by oxidation with a substantially similar oxidation rate, while the removal of the oxide material from above the active region 202A based on an etch mask may result in a non-symmetrical material loss in the adjacent isolation regions 202C.

Figure 2L:
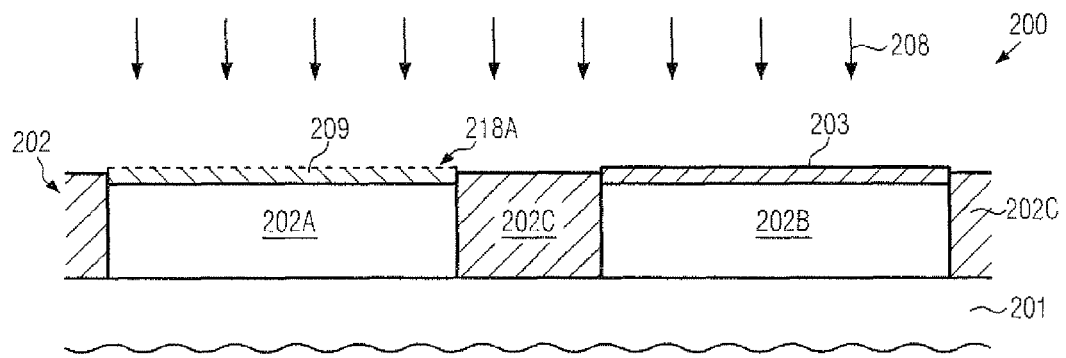

FIG. 2l schematically illustrates the device 200 in a manufacturing stage in which the semiconductor alloy 209 may be formed in the recess 218A during the selective epitaxial growth process 208, as is described above with reference to FIG. 2c. Thereafter, the mask 203 may be removed by applying any appropriate etch technique, such as the etch process 210 as is, for instance, described above with reference to FIG. 2d.

Hence, the process sequence for forming the mask 203 and the recess 218A may be accomplished on the basis of the implantation mask 212 (FIG. 2h), which, however, may be required in any other process strategy so that any additional lithography processes may be avoided. Thereafter, the processing may be continued by incorporating the well dopant species in the active region 202A, as is described above.

As a result, the present disclosure provides semiconductor devices and techniques in which a threshold adjusting semiconductor alloy, such as a silicon/germanium alloy, may be provided with superior uniformity by recessing the active region prior to growing the semiconductor alloy. Consequently, the thickness and material composition of the threshold adjusting semiconductor alloy may be enhanced compared to conventional strategies since exposed surface areas of the active region may be avoided. The recessing of the active region is performed prior to incorporating the well dopant species, thereby avoiding undue dopant loss, which may otherwise result in a shift of the finally obtained threshold voltage. In the embodiments described above, the implantation of the well dopants may be performed after forming the semiconductor alloy. In other embodiments, the well dopant species may be incorporated after recessing the active region and prior to depositing the threshold adjusting semiconductor material. In this case, the semiconductor material may be grown so as to have any appropriate material composition, for instance in view of any dopant species that may be efficiently incorporated during the deposition process, if required. Hence, a high degree of compatibility with the conventional strategy may be achieved, since also in this case the threshold adjusting semiconductor material may be provided after incorporating the well dopant species, however, without contributing to dopant loss.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   removing material of an active region selectively to an isolation structure so as to form a recess, said isolation structure laterally delineating said active region in a semiconductor layer of a semiconductor device;
   forming a layer of a semiconductor alloy in said recess;
   introducing a well dopant species into said active region through said layer of a semiconductor alloy;
   forming a gate electrode structure of a transistor on said layer of a semiconductor alloy, said gate electrode structure comprising a high-k dielectric gate insulation layer and a metal-containing gate electrode material formed on said high-k dielectric gate insulation layer; and
   introducing a further dopant species into said active region so as to form source and drain regions of said transistor therein, said further dopant species being of an opposite conductivity type to said well dopant species.

2. The method of claim 1, further comprising forming a mask on a second active region formed in said semiconductor layer prior to removing said material of said active region.

3. The method of claim 2, further comprising removing said mask after forming said semiconductor alloy in said recess and introducing a second well dopant species into said second active region.

4. The method of claim 1, further comprising introducing a second well dopant species into a second active region and performing an oxidation process so as to form a mask material on said active region and said second active region.

5. The method of claim 4, further comprising exposing said mask material formed on said active region and said second active region to an etch ambient so as to remove said mask material selectively from said active region and preserve a portion of said mask material on said second active region so as to further cover said second active region.

6. The method of claim 5, wherein removing material of said active region so as to form said recess comprises using said preserved portion of said mask material as an etch mask.

7. The method of claim 5, wherein forming a layer of a semiconductor alloy material in said recess comprises using said preserved portion of said mask material as a growth mask.

8. The method of claim 1, wherein removing said material of said active region and forming said layer of a semiconductor alloy comprises establishing a process ambient in a single process chamber.

9. The method of claim 8, wherein forming said layer of semiconductor alloy comprises performing a selective epitaxial growth process so as to suppress material deposition on said isolation structure.

10. The method of claim 9, wherein removing material of said active region comprises establishing an ambient in said process chamber on the basis of a portion of gas components that are used for performing said selective epitaxial growth process.

11. The method of claim 1, wherein said layer of semiconductor alloy is formed as a silicon/germanium alloy.

12. The method of claim 1, wherein said gate electrode structure is formed after introducing said well dopant species into said active region.

13. A method, comprising:
   forming a recess in an active region of a semiconductor device, said active region being laterally delineated in a semiconductor layer by an isolation structure;
   forming a threshold adjusting semiconductor material in said recess by performing a selective epitaxial growth process;
   introducing a well dopant species into said active region after forming said recess;
   forming a gate electrode structure of a transistor on said threshold adjusting semiconductor material; and
   introducing a further dopant species into said active region so as to form source and drain regions of said transistor therein, said further dopant species being of an opposite conductivity type to said well dopant species.

14. The method of claim 13, wherein forming said gate electrode structure comprises forming a high-k dielectric material above said threshold adjusting semiconductor material and forming a metal-containing electrode material on said high-k dielectric material.

15. The method of claim 13, wherein said well dopant species is introduced through said threshold adjusting semiconductor material.

16. The method of claim 13, wherein forming said recess and forming said threshold adjusting semiconductor material are performed in the same process chamber as an in situ process.

17. The method of claim 13, further comprising introducing a second well dopant species into a second active region prior to forming said recess in said active region, wherein said second well dopant species increases an oxidation rate in said second active region compared to said active region.

18. The method of claim 17, further comprising forming a mask material in said active region and said second active region by performing an oxidation process and exposing said mask material to an etch ambient in said active region and said second active region so as to selectively remove said mask material in said active region and to preserve a portion of said mask material in said second active region.

19. The method of claim 13, wherein said gate electrode structure is formed after introducing said well dopant species into said active region.

20. The method of claim 13, wherein said well dopant species is introduced prior to forming said threshold adjusting semiconductor material in said recess.

21. A method, comprising:
forming a recess in an active region of a semiconductor device, said active region being laterally delineated in a semiconductor layer by an isolation structure;
after forming said recess, introducing a well dopant species into said active region;
after introducing said well dopant species into said active region, forming a threshold adjusting semiconductor material in said recess by performing a selective epitaxial growth process; and
forming a gate electrode structure of a transistor on said threshold adjusting semiconductor material.

22. A method, comprising:
forming a recess in a first active region of a semiconductor device, said first active region being laterally delineated in a semiconductor layer by an isolation structure;
forming a threshold adjusting semiconductor material in said recess by performing a selective epitaxial growth process;
introducing a first well dopant species into said first active region after forming said recess;
introducing a second well dopant species into a second active region of said semiconductor device prior to forming said recess in said first active region, wherein said second well dopant species increases an oxidation rate in said second active region compared to said first active region; and
forming a gate electrode structure of a transistor on said threshold adjusting semiconductor material.

* * * * *